US007560923B2

United States Patent
Viswanathan

(10) Patent No.: US 7,560,923 B2
(45) Date of Patent: *Jul. 14, 2009

(54) SIGNAL ACQUISITION AND PROCESSING METHOD AND APPARATUS FOR MAGNETIC RESONANCE IMAGING

(76) Inventor: Raju R. Viswanathan, 8107 Colmar Dr., Clayton, MO (US) 63105

( * ) Notice: Subject to any disclaimer, the term of this patent is extended or adjusted under 35 U.S.C. 154(b) by 0 days.

This patent is subject to a terminal disclaimer.

(21) Appl. No.: 11/981,865

(22) Filed: Oct. 31, 2007

(65) Prior Publication Data

US 2008/0164873 A1    Jul. 10, 2008

Related U.S. Application Data

(63) Continuation of application No. 11/713,957, filed on Mar. 4, 2007, now Pat. No. 7,525,310.

(60) Provisional application No. 60/778,652, filed on Mar. 4, 2006.

(51) Int. Cl.
*G01V 3/00* (2006.01)
(52) U.S. Cl. .................................................. 324/307
(58) Field of Classification Search ......... 324/300–322; 600/410–435; 335/296–306
See application file for complete search history.

(56) References Cited

U.S. PATENT DOCUMENTS

| 4,359,706 A | | 11/1982 | Flack | |
| 4,385,277 A | * | 5/1983 | Hanley | 324/309 |
| 4,876,508 A | * | 10/1989 | Taylor | 324/309 |
| 4,949,042 A | * | 8/1990 | Kuhara et al. | 324/311 |
| 5,351,007 A | | 9/1994 | Withers et al. | |
| 5,650,724 A | * | 7/1997 | Yamagata | 324/320 |
| 6,317,619 B1 | | 11/2001 | Boernert et al. | |
| 6,570,383 B1 | * | 5/2003 | McKinnon et al. | 324/314 |
| 6,704,594 B1 | * | 3/2004 | Blank et al. | 600/423 |
| 6,781,492 B2 | * | 8/2004 | Takeshima et al. | 335/216 |
| 6,804,546 B1 | * | 10/2004 | Thompson et al. | 600/410 |
| 6,828,786 B2 | | 12/2004 | Scherer et al. | |
| 7,109,709 B2 | * | 9/2006 | Asano | 324/307 |
| 7,141,970 B2 | * | 11/2006 | Miyawaki et al. | 324/307 |
| 7,196,518 B2 | * | 3/2007 | Yatsui et al. | 324/307 |

(Continued)

FOREIGN PATENT DOCUMENTS

JP    07079954 A    *    3/1995

OTHER PUBLICATIONS

Gael Le Bec et al.; "Inside-out NMR probe for portable spectrometry"; Proceedings of the 28th IEEE, EMBS Annual International Conference; Aug. 30-Sep. 3, 2006; pp. 1901-1903.*

*Primary Examiner*—Brij B. Shrivastav
*Assistant Examiner*—Dixomara Vargas
(74) *Attorney, Agent, or Firm*—Russ Weinzimmer

(57) ABSTRACT

A method and apparatus are disclosed for Magnetic Resonance Imaging using specialized signal acquisition and processing techniques for image reconstruction with a generally inhomogeneous static magnetic field. New signal processing methods for image reconstruction and for minimizing dephasing effects are disclosed. Imaging systems with smaller static magnetic field strengths and smaller hardware demands than those with homogeneous static magnetic fields are provided, leading to significant reductions in system size and cost as compared to standard MRI systems. Such systems can also exploit imaging coils having high Signal-to-Noise-Ratio (SNR), including those made from Carbon nanotube conductors, leading to further imaging system efficiencies.

30 Claims, 9 Drawing Sheets

U.S. PATENT DOCUMENTS

| | | |
|---|---|---|
| 7,319,326 B2 * | 1/2008 | Balcom et al. ............... 324/318 |
| 7,358,725 B2 * | 4/2008 | Blanz ......................... 324/303 |
| 2003/0206017 A1 | 11/2003 | Boskamp |
| 2004/0241339 A1 | 12/2004 | Anazawa et al. |
| 2005/0030032 A1 | 2/2005 | Kwok et al. |
| 2007/0268020 A1 * | 11/2007 | Viswanathan ............... 324/309 |

* cited by examiner

SIGNAL ACQUISITION AND PROCESSING METHOD AND APPARATUS FOR MAGNETIC RESONANCE IMAGING

CROSS-REFERENCES TO RELATED APPLICATIONS

This application is a continuation entitled to the benefit of U.S. patent application Ser. No. 11/713,957 entitled "SIGNAL ACQUISITION AND PROCESSING METHOD AND APPARATUS FOR MAGNETIC RESONANCE IMAGING", filed Mar. 4, 2007 now U.S. Pat. No. 7,525,310, herein incorporated by reference.

U.S. patent application Ser. No. 11/713,957 is entitled to the benefit of U.S. Provisional Patent Application No. 60/778,652, entitled "SIGNAL ACQUISITION AND PROCESSING METHOD AND APPARATUS FOR MAGNETIC RESONANCE IMAGING", filed Mar. 4, 2006, herein incorporated by reference.

FIELD OF THE INVENTION

The present invention relates generally to medical imaging and image reconstruction, and specifically to Magnetic Resonance Imaging in the presence of static magnetic fields with an intrinsic field gradient.

BACKGROUND OF THE INVENTION

Magnetic Resonance (MR) Imaging technology is quite commonly used today in larger medical institutions worldwide, and has led to huge benefits in the practice of medicine. A significant factor affecting further use of this versatile imaging technology is the high cost associated with such systems, both for purchase and maintenance.

The high costs associated with design and manufacture of such systems are due in large part to the necessity for a large and very homogeneous static magnetic field, as well as the need for gradient field producing apparatus for imaging with such systems; such large static fields are currently required in order to obtain high image quality and resolution. In such systems the high degree of field homogeneity together with the use of uniform gradient magnetic fields that are applied for imaging purposes, permits a straightforward recovery of the proton or nuclear density distribution in the imaged sample by means of direct Fourier inversion of the received signals. However, the need for substantial homogeneity in the static magnetic field associated with a Magnetic Resonance Imaging system adversely impacts system size and cost.

To achieve a significant reduction in system size and cost of MR Imaging systems, it is useful to be able to image with inhomogeneous static magnetic fields. Typically, current existing commercial methodologies are predicated on the use of a very homogeneous static magnetic field and cannot be used in the presence of inhomogeneous magnetic fields.

Previous attempts at constructing a method for MR Imaging with inhomogeneous static fields have assumed a static magnetic field inhomogeneity that is substantially in a single spatial direction, for instance by exciting nuclear spins at or near a measurement surface that corresponds to an isosurface of constant static magnetic field magnitude, with a substantially constant field gradient in a direction normal to the measurement surface, denoted as the z-direction. The latter substantially constant behavior of field gradient implies that the measurement surface is substantially planar. In such schemes, the gradient magnitude is assumed to be quite large in the z-direction, typically of the order of 400 Gauss/cm or 0.04 Tesla/cm. This large gradient magnitude leads to rapid dephasing of the spins after excitation by application of suitable Radio Frequency (RF) pulses. However, this same large gradient can yield short refocusing times when a suitable Radio Frequency pulse sequence is applied in the form of a standard 90-180 spin echo pulse sequence, where the refocusing 180-pulses are applied at a rate proportional to the z-gradient. Repeated spin echoes are thereby produced, and are used to create an averaged or enhanced signal in a time period that is not too large. Suitable intra-slice voxel encoding in the form of applied x- and y-gradients further is used, together with standard MR Imaging and signal inversion techniques to reconstruct an image of the (thin) neighborhood of the measurement surface.

Extensions of such methods include subslicing, wherein an image of a tissue slice is formed by dividing the slice into a number of subslices, the number being determined by the ratio of $T_1$ and $T_2$ relaxation times of the tissue. The subslice images are combined to form an image of the slice. Each subslice is imaged by using a narrow bandwidth Radio Frequency pulse with a frequency equal to the Larmor frequency corresponding to that subslice. Repeated spin echoes are used to create an averaged or enhanced signal in a time period that is not too large. Suitable intra-slice voxel encoding in the form of applied x- and y-gradients further can be used together with standard MR Imaging and signal inversion techniques to reconstruct an image of the subslice. Similar methods are used to image a slice of tissue in the presence of a strong z-gradient by spread spectrum methods to suppress the effect of perturbations in the static field. Repeated spin echoes are used to create an averaged or enhanced signal in a time period that is not too large. Suitable intra-slice voxel encoding in the form of applied x- and y-gradients further can be used together with standard MR Imaging and signal inversion techniques to reconstruct an image of the slice.

The methods mentioned above use a static magnetic field with a pattern of inhomogeneity or gradient in a single spatial direction. Magnets producing such a field pattern in a significantly large volume of interest within a patient for use as a general purpose imaging system would physically be quite large. As a practical matter, while these methods could be used to develop smaller imaging systems to image extremities or small peripheral portions of patient anatomy, they do not easily permit general internal imaging of patient anatomy.

There have been early attempts to develop an imaging probe akin to a catheter with an MR Imaging system utilizing magnets mounted on the probe. The probe is used for "inside-out" imaging to generate an image of a small local region in the anatomy of interest that is external to the probe itself. It produces an image of a wedge-shaped region transverse to the long axis of the probe by using an inhomogeneous static magnetic field produced by the catheter-mounted magnet(s). The strong radial gradient of these magnets, together with catheter-mounted gradient coils that produce a circumferential gradient, are used to phase encode spins in the wedge-shaped region after they are excited by Radio Frequency signals transmitted by transmission coils also mounted on the probe. As in the previously-mentioned methods, repeated spin echoes followed by signal averaging are used to overcome dephasing effects, and standard MR Imaging and signal inversion techniques are then employed to reconstruct an image of the thin wedge-shaped region. By translation of the probe in the longitudinal direction, and rotation of the probe about its axis, an annular cylindrical region surrounding the probe can be imaged. Magnets can also be mounted on an MR imaging probe to create a strong, inhomogeneous local gradient in the presence of a static magnetic field that is produced by a standard MR Imaging system. The local imaging techniques described earlier in this paragraph can generate a high resolution local image of a local region surrounding the probe, which can then be superimposed on a larger field-of-view image generated by the standard MR Imaging system.

The imaging methods discussed in the previous paragraph are specifically designed for use in external imaging in a local region around a probe. They rely on the use of repeated spin echoes and averaging in the presence of a strong locally produced gradient. Furthermore, the use of an imaging probe is invasive. As such, these techniques do not permit general, non-invasive imaging within a wide field-of-view.

SUMMARY OF THE INVENTION

An aspect of the invention is a method for signal acquisition and reconstruction that can be used for efficient MR Imaging, using generally inhomogeneous static magnetic fields.

Another aspect of the invention is a method of general purpose MR imaging employing generally inhomogeneous static magnetic fields that can lead to the construction of relatively small-footprint MR imaging systems at minimal cost.

A further aspect of the invention is a method and apparatus for Magnetic Resonance Imaging in the presence of a static magnetic field with a known spatial distribution of intrinsic magnetic field gradient. The method includes in some embodiments the use of specialized imaging coils possessing high Signal-to-Noise-Ratio (SNR). In these embodiments, the imaging or receiving coils are made from an electrical conductor, such as carbon in the form of carbon nanotubes. In one embodiment, the resistance of this conductor does not increase significantly with length, a phenomenon known as ballistic charge transport. The coils are used to acquire Radio Frequency (RF) signals emitted by precessing proton spins in the sample to be imaged. Further, similar coils can also be used as transmitter coils to transmit RF signals needed to rotate or flip the proton spins in the sample causing them to begin precessing. In alternate embodiments, high conductivity metals such as Copper or Silver can be used in the receiver or transmitter coils.

In preferred embodiments, the method of the invention starts with a known distribution of the static magnetic field produced by the magnet(s) of the imaging system. The method and apparatus of the invention divides the imaging volume into zones separated by isomagnitude contour surfaces. Each zone is thin enough such that, to a substantial extent, the field magnitude varies linearly within the zone. The direction of variation of the field magnitude is normal to the isomagnitude contours by definition, so that the local field gradient direction known everywhere for each zone.

By RF excitation of the spins in each zone, and an analysis according to the methods of the invention described herein of the signals emitted by the subsequent precession of the spins as they relax back into alignment with the local static field, the local spatial spin density can be reconstructed within each zone, thereby yielding an image of the volume or anatomy of interest. Instead of the Fourier inversion employed by standard MR Imaging systems, the signal inversion method according to the present invention involves solution of a certain system of equations, detailed further below.

Conducting materials with interesting electrical properties, such as full or partial ballistic conductance, are used to make imaging coils in preferred embodiments of the invention. An example of such a material is a film drawn from carbon nanotubes. The relatively low electrical noise levels associated with such conductors permit the construction of RF receiving electronics circuitry with large Quality Factors, yielding maximum power reception, and thereby providing high signal quality and narrow bandwidth for highly selective imaging and optimal zone selection. The narrow bandwidth that can be attained thereby can be used for efficient imaging in the presence of an inhomogeneous static magnetic field, where slice selectivity for imaging is enhanced accordingly.

The invention teaches a method for making high-quality integrated imaging systems that are also relatively low in weight, in some cases so low in weight as to be portable.

In preferred embodiments, the imaging coils of the invention exploit ballistic conductance properties to optimize the $B_1$ magnetic field within the imaging volume produced by the imaging coil per unit current flowing through the coil. In preferred embodiments of the invention, carbon nanotube conductors are made in thin film form with very small thickness at no cost in terms of increased resistance and are formed into geometrical shapes that create a relatively large $B_1$ magnetic field within the imaging volume, while at the same time possessing only a small electrical resistance, thereby offering very high SNR values.

Accordingly, one general aspect of the invention is an apparatus for magnetic resonance imaging. The apparatus includes: at least one magnet generating an externally applied static magnetic field within an imaging volume; a spatially inhomogeneous distribution of the static magnetic field with non-planar isomagnitude contours within the imaging volume; at least one gradient field-producing coil capable of producing a magnetic field gradient in a known spatial direction within the imaging volume; Radio Frequency electronic circuitry and transmission means for the generation and transmission into the imaging volume of Radio Frequency pulses with known pulse parameters; at least one receiving coil to receive Radio Frequency signals emitted by nuclear spins in the imaging volume; and a processor to computationally process the received Radio Frequency signals to reconstruct an image representing the distribution of nuclear spin density within at least a portion of the imaging volume.

In preferred embodiments, the at least one gradient field-producing coil is part of a set of coils.

In preferred embodiments, the Radio Frequency electronic circuitry is capable of generating a range of Radio Frequency pulses, each pulse being centered around one of a plurality of frequencies within a range of frequencies from a minimum frequency to a maximum frequency.

In preferred embodiments, the difference between the maximum frequency and minimum frequency is between about 0.01% and 10% of the maximum frequency.

In preferred embodiments, the difference between the maximum frequency and minimum frequency is between about 10% and 90% of the maximum frequency.

In preferred embodiments, the static magnetic field within the imaging volume is an externally applied static magnetic field.

In preferred embodiments, the Radio Frequency electronic circuitry and transmission means is programmable.

In preferred embodiments, each of the Radio Frequency pulses centered around one of the plurality of frequencies excites nuclear spins within one spatial zone among a plurality of spatial zones covering the entire imaging volume.

In preferred embodiments, the Radio Frequency electronics receives Radio Frequency signals from a first spatial zone within the imaging volume while simultaneously transmitting at least one Radio Frequency pulse that excites nuclear spins in a second spatial zone distinct from the first spatial zone.

In preferred embodiments, the Radio Frequency electronics sequentially generates Radio Frequency pulse transmissions that cause excitation of nuclear spins in a first spatial zone prior to excitation of nuclear spins in a second spatial zone.

In preferred embodiments, the at least one receiving coil to receive Radio Frequency signals emitted by nuclear spins in the imaging volume includes: a plurality of receiving coils arranged as a phased array of receiving coils.

In preferred embodiments, the Radio Frequency electronic circuitry is capable of generating a range of Radio Frequency pulses, wherein each Radio Frequency pulse is a superposition in the frequency domain of distinct pieces, each piece centered around one of a plurality of frequencies within a range of frequencies from a minimum frequency to a maximum frequency.

In preferred embodiments, each Radio Frequency pulse excites nuclear spins simultaneously within more than one spatial zone among a plurality of spatial zones covering the entire imaging volume.

In preferred embodiments, the Radio Frequency electronics receives Radio Frequency signals from at least one spatial zone in a first set of spatial zones, while simultaneously transmitting at least one Radio Frequency pulse that excites nuclear spins in at least one spatial zone in a second set of spatial zones distinct from the first set of spatial zones.

In preferred embodiments, the difference between the maximum frequency and minimum frequency is between about 10% and 90% of the maximum frequency.

In preferred embodiments, the difference between the maximum frequency and minimum frequency is between about 0.01% and 10% of the maximum frequency.

In preferred embodiments, each piece centered around one of a plurality of frequencies excites nuclear spins within one spatial zone among a plurality of zones covering the entire imaging volume.

In preferred embodiments, the Radio Frequency electronic circuitry sequentially generates Radio Frequency pulse transmissions that cause excitation of nuclear spins in a first set of spatial zones prior to excitation of nuclear spins in a second set of spatial zones.

In preferred embodiments, wherein the Radio Frequency electronic circuitry is capable of generating Radio Frequency pulses centered around each one of a plurality of frequencies within a range of frequencies from a minimum frequency to a maximum frequency.

In preferred embodiments, the difference between the maximum frequency and minimum frequency is between about 0.01% and 10% of the maximum frequency.

In preferred embodiments, wherein the difference between the maximum frequency and minimum frequency is between about 10% and 90% of the maximum frequency.

In preferred embodiments, each of the Radio Frequency pulses excites nuclear spins within one spatial zone among a plurality of zones covering the entire imaging volume.

In preferred embodiments, the Radio Frequency electronic circuitry receives Radio Frequency signals from a first spatial zone within the imaging volume, while simultaneously transmitting at least one Radio Frequency pulse that excites nuclear spins in a second spatial zone distinct from the first spatial zone.

In preferred embodiments, the Radio Frequency electronic circuitry sequentially generates Radio Frequency pulse transmissions that cause excitation of nuclear spins in a first spatial zone, prior to excitation of nuclear spins in a second spatial zone.

In preferred embodiments, the at least one receiving coil includes a conductor made from Carbon nanotube material.

In preferred embodiments, the at least one receiving coil is made from a layered structure of Carbon nanotube sheets electrically connected in parallel.

In preferred embodiments, the magnetic field gradient is produced substantially only in a single known spatial direction within the imaging volume.

In preferred embodiments, at least one receiving coil includes a conductor made from Carbon nanotube material.

In preferred embodiments, at least one receiving coil is made from a layered structure of Carbon nanotube sheets electrically connected in parallel.

In preferred embodiments, the magnetic field gradient is produced substantially only in a single known spatial direction within the imaging volume.

Another general aspect of the invention is a method for Magnetic Resonance Imaging that employs the presence of a spatially inhomogeneous static magnetic field within an imaging volume. The method includes: exciting nuclear spins within at least one spatial zone among a set of spatial zones that cover the imaging volume by means of Radio Frequency pulse generation and transmission; receiving Radio Frequency signals emitted by the nuclear spins from at least one of the spatial zones; and computationally processing the received Radio Frequency signals to reconstruct an image representing the spatial distribution of nuclear spin density within the at least one spatial zone.

In preferred embodiments, the spatially inhomogeneous static magnetic field has non-planar isomagnitude contours within the imaging volume.

In preferred embodiments, the spatial distribution of nuclear spin density within the entire imaging volume is reconstructed by composition of the reconstructions of the nuclear spin density in each spatial zone of the set of spatial zones that cover the image volume.

In preferred embodiments, exciting nuclear spins is followed by a phase encoding time period wherein spin precession occurs in the presence of a magnetic field gradient in at least one spatial direction generated by at least one gradient field-producing coil.

In preferred embodiments, receiving Radio Frequency signals emitted by the nuclear spins from at least one of the spatial zones occurs in the presence of a magnetic field gradient in at least one spatial direction generated by at least one gradient field-producing coil.

In preferred embodiments, the spatial distribution of nuclear spin density within the entire imaging volume is reconstructed by composition of the reconstructions of the nuclear spin density in the individual spatial zones.

In preferred embodiments, the spatial distribution of nuclear spin density within the entire imaging volume is reconstructed by composition of the reconstructions of the nuclear spin density in the individual spatial zones.

In preferred embodiments, at least one spin refocusing Radio Frequency pulse sequence is transmitted to cause the nuclear spins in the at least one spatial zone to emit a subsequent series of spin echo signals that are further processed to yield an averaged signal with enhanced Signal to Noise Ratio for use in computationally processing the received Radio Frequency signals to reconstruct an image representing the spatial distribution of nuclear spin density within the at least one spatial zone.

In preferred embodiments, the computational processing includes Fourier transformation of the received signals, and further solution of an integral equation system to reconstruct an image representing the spatial distribution of nuclear spin density within the at least one spatial zone.

In preferred embodiments, the spatial distribution of nuclear spin density within an entire imaging volume is reconstructed by composition of the reconstructions of the nuclear spin density in individual spatial zones within the entire imaging volume.

In preferred embodiments, exciting nuclear spins is followed by a phase encoding time period wherein spin precession occurs in the presence of a magnetic field gradient in at least one spatial direction generated by at least one gradient field-producing coil.

In preferred embodiments, the reception of Radio Frequency signals from the nuclear spins in at least one spatial zone occurs in the presence of a magnetic field gradient in at least one spatial direction generated by at least one gradient field-producing coil.

In preferred embodiments, the reception of Radio Frequency signals from the nuclear spins in at least one spatial zone occurs in the presence of a magnetic field gradient generated substantially only in a single known spatial direction within the imaging volume by at least one gradient field-producing coil.

In preferred embodiments, the excitation of the nuclear spins within the at least one spatial zone is followed by a phase encoding time period wherein spin precession occurs in the presence of a magnetic field gradient generated substantially only in a single known spatial direction within the imaging volume by at least one gradient field-producing coil.

In preferred embodiments, the spatial distribution of nuclear spin density within an entire imaging volume is reconstructed by composing the reconstructions of the nuclear spin density in the individual spatial zones.

In preferred embodiments, the spatial distribution of nuclear spin density within an entire imaging volume is reconstructed by composing the reconstructions of the nuclear spin density in the individual spatial zones.

In preferred embodiments, at least one spin refocusing Radio Frequency pulse sequence is transmitted to cause the nuclear spins in the at least one spatial zone to emit a subsequent series of spin echo signals that are further processed to yield an averaged signal with enhanced Signal to Noise Ratio for use in reconstructing the entire imaging volume.

In preferred embodiments, computationally processing the received Radio Frequency signals to reconstruct an image requires solution of a system of equations for spin density distribution that cannot be solved by a direct Fourier inversion technique.

In preferred embodiments, spatial distribution of nuclear spin density within an entire imaging volume is reconstructed by composing the reconstructions of nuclear spin density in individual spatial zones.

In preferred embodiments, excitation of nuclear spins within the at least one spatial zone is followed by a phase encoding time period wherein spin precession occurs within a magnetic field gradient in at least one spatial direction generated by at least one gradient field-producing coil.

In preferred embodiments, reception of Radio Frequency signals from nuclear spins in at least one spatial zone occurs within a magnetic field gradient in at least one spatial direction generated by at least one gradient field-producing coil.

In preferred embodiments, spatial distribution of nuclear spin density within an entire imaging volume is reconstructed by composition of reconstructions of the nuclear spin density in individual spatial zones.

In preferred embodiments, spatial distribution of nuclear spin density within an entire imaging volume is reconstructed by composition of reconstructions of the nuclear spin density in the individual spatial zones.

In preferred embodiments, at least one spin refocusing Radio Frequency pulse sequence is transmitted to cause the nuclear spins in the at least one spatial zone to emit a subsequent series of spin echo signals that are further processed to yield an averaged signal with enhanced Signal to Noise Ratio.

In preferred embodiments, computationally processing employs an iterative technique for solving a system of equations for spin density distribution.

In preferred embodiments, spatial distribution of nuclear spin density within an entire imaging volume is reconstructed by composition of reconstructions of nuclear spin density in individual spatial zones.

In preferred embodiments, excitation of the nuclear spins within the at least one spatial zone is followed by a phase encoding time period wherein spin precession occurs within a magnetic field gradient in at least one spatial direction generated by at least one gradient field-producing coil.

In preferred embodiments, reception of Radio Frequency signals from nuclear spins in at least one spatial zone occurs within a magnetic field gradient in at least one spatial direction generated by at least one gradient field-producing coil.

In preferred embodiments, spatial distribution of nuclear spin density within an entire imaging volume is reconstructed by composition of reconstructions of the nuclear spin density in the individual spatial zones.

In preferred embodiments, spatial distribution of nuclear spin density within an entire imaging volume is reconstructed by composition of reconstructions of the nuclear spin density in individual spatial zones.

In preferred embodiments, at least one spin refocusing Radio Frequency pulse sequence is transmitted to cause the nuclear spins in the at least one spatial zone to emit a subsequent series of spin echo signals that are further processed to yield an averaged signal with enhanced Signal to Noise Ratio.

In preferred embodiments, receiving Radio Frequency signals emitted by the nuclear spins from at least one of the spatial zones includes: using at least one receiver coil employing a conductor made from Carbon nanotube material In preferred embodiments, the at least one receiver coil is made from a layered structure of Carbon nanotube sheets electrically connected in parallel.

In preferred embodiments, at least one spin refocusing Radio Frequency pulse sequence is transmitted to cause the nuclear spins in the at least one spatial zone to emit a subsequent series of spin echo signals that are further processed to yield an averaged signal with enhanced Signal to Noise Ratio for use in a reconstruction process.

In preferred embodiments, spatial distribution of nuclear spin density within an entire imaging volume is reconstructed by composition of reconstructions of nuclear spin density in the individual spatial zones.

In preferred embodiments, excitation of the nuclear spins within the at least one spatial zone is followed by a phase encoding time period wherein spin precession occurs within a magnetic field gradient in at least one spatial direction generated by at least one gradient field-producing coil.

In preferred embodiments, reception of Radio Frequency signals from nuclear spins in at least one spatial zone occurs within a magnetic field gradient in at least one spatial direction generated by at least one gradient field-producing coil.

In preferred embodiments, spatial distribution of nuclear spin density within an entire imaging volume is reconstructed by composition of reconstructions of the nuclear spin density in the individual spatial zones.

In preferred embodiments, spatial distribution of nuclear spin density within an entire imaging volume is reconstructed by composition of reconstructions of the nuclear spin density in the individual spatial zones.

Another general aspect of the invention is an apparatus for Magnetic Resonance Imaging. The apparatus includes: at least one magnet generating a static magnetic field within an imaging volume; at least one gradient field-producing coil capable of producing a magnetic field gradient in a known spatial direction within the imaging volume; programmable Radio Frequency electronic circuitry and transmission means to drive the generation and transmission of Radio Frequency pulses with known pulse parameters into the imaging volume; at least one receiver coil to receive Radio Frequency signals emitted by nuclear spins in the imaging volume, wherein the receiving coil is constructed with an electrical conductor in the form of layered Carbon nanotube sheets; and means to computationally process the received Radio Frequency signals to reconstruct an image representing the distribution of nuclear spin density within at least a portion of the imaging volume.

In preferred embodiments, the at least one Radio Frequency receiver coil is constructed from an electrical conductor in the form of nested layers of Carbon nanotube sheets.

BRIEF DESCRIPTION OF THE DRAWING

The invention will be more fully understood by reference to the detailed description, in conjunction with the following figures, wherein.

DETAILED DESCRIPTION

Figure 1:
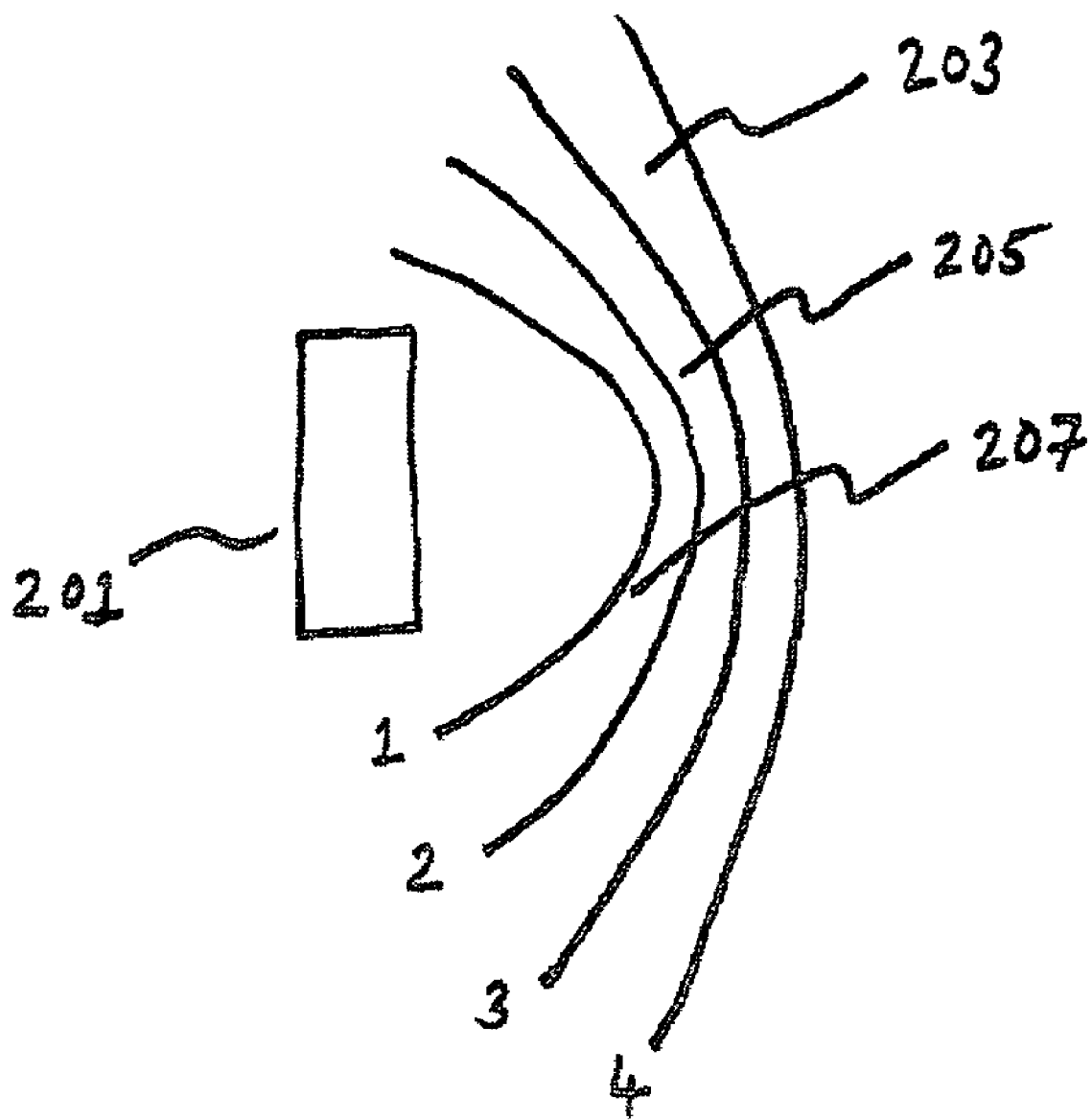
FIG. 1 is a two-dimensional field diagram showing the field magnitude pattern of the static magnetic field produced by a magnet, showing two-dimensional isomagnitude surfaces (also called contours) demarking zones of the field magnitude pattern according to lines of constant field magnitude.

With reference to FIG. 1, in a preferred embodiment, a static magnetic field is generated by a single permanent magnet 201 (which could itself be a compound structure assembled from a variety of smaller magnets, with possibly varying magnetization directions) that generates a (typically inhomogeneous) magnetic field within a region of interest.

Standard Magnetic Resonance signal processing techniques are influenced by dephasing of the spins in the presence of inhomogeneities in the static magnetic field, leading to substantial signal decoherence or loss, whereupon image reconstruction becomes difficult or impossible. The teaching of the present invention provides a method of avoiding or greatly minimizing dephasing effects by taking into account the spatial variation of the static magnetic field, together with appropriate voxel shape selection and signal processing methodologies.

As shown in FIG. 1, the resulting magnetic field pattern can be divided into zones 203, 205, 207 separated by isomagnitude surfaces $S_1$, $S_2$, $S_3$ and $S_4$ denoted 1, 2, 3 and 4 respectively. The magnetic field strength everywhere on an isomagnitude surface is constant. The direction of variation of the magnetic field strength near such a surface is thus normal (perpendicular) to the surface. In FIG. 1, surfaces $S_1$, $S_2$, $S_3$ and $S_4$ denoted 1, 2, 3 and 4 respectively in the Fig. divide the magnetic field distribution produced by magnet 201 into zones $Z_1$, $Z_2$ and $Z_3$ referred to as 207, 205 and 203 respectively. Each isomagnitude surface $S_i$ has a corresponding field magnitude associated with it. Surface $S_1$, for example, is an isomagnitude surface such that the field strength changes in magnitude at a given point on the surface only in a direction normal to the surface at the given point. We assume that the field pattern and its subdivision into isomagnitude surfaces is known for the given magnet. For example, such information can be obtained from a computational simulation of the spatial magnetic field magnitude distribution corresponding to the magnet.

Figure 2:
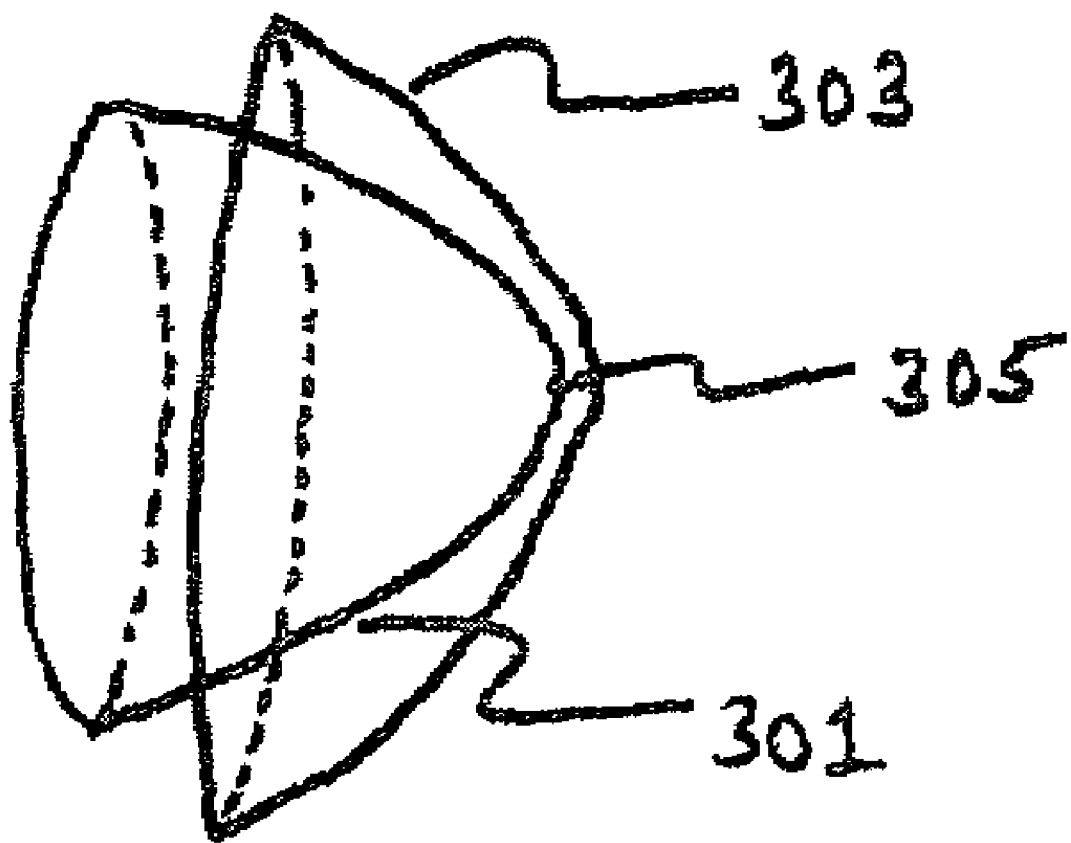
FIG. 2 is a three-dimensional field diagram showing two three-dimensional isomagnitude surfaces defining a spatial zone between the two isomagnitude surfaces, the diagram also illustrating the behavior of the intrinsic static magnetic field gradient.

For a zone that is sufficiently thin, the variation in magnitude is linear within the zone, and falls off with increasing distance from the magnet in a gradient direction determined by the normal to the isomagnitude surface nearest to the magnet. The rate of decrease in field strength, or the gradient magnitude, is itself a function of location on the surface, as shown in FIG. 2. Isomagnitude surfaces 301 and 303 are shown in FIG. 2. As an illustration of the functional behavior of the gradient, at locations close to the point P indicated by 305 (on surface 301) in FIG. 2, the field gradient is maximal, while at locations further away on the surface the field gradient is smaller in magnitude.

When the isomagnitude contours are suitably chosen, the field magnitude varies linearly within each zone in a direction normal to the surface. Each such zone has a reference field magnitude (without loss of generality, field strength of the zone is chosen to be the field strength of a "central isomagnitude surface" between the two bounding isomagnitude surfaces that define a zone), and a defined variation in field strength with respect to the reference field magnitude. For example, with reference to FIG. 1, zone $Z_2$ has a reference field magnitude corresponding to a field strength midway between that associated with surface $S_1$ and the field strength associated with surface $S_2$. Corresponding to the reference field magnitude is its associated Radio Frequency (RF) central precession frequency. This frequency is the natural frequency of precession for the nuclear spins to realign with the static magnetic field after they have been tipped out of alignment by an applied RF field. For a field strength $B_0$, the associated precession frequency for Hydrogen nucleii (which determines the response of water molecules in the imaged sample) is $$\omega = \gamma B_0 \quad (1)$$

where $\gamma = 2.68 \times 10^8$ rad/s/Tesla is the proton gyromagnetic ratio.

Figure 3:
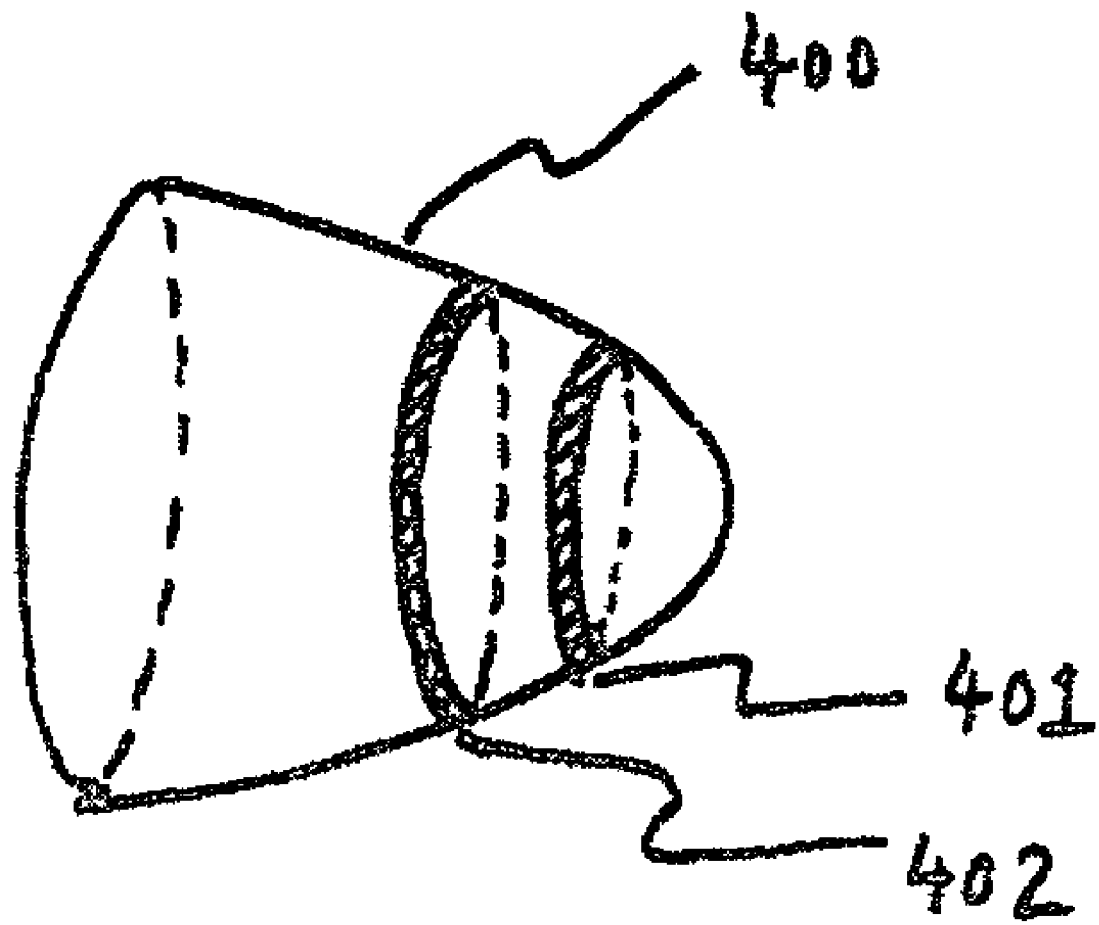
FIG. 3 is a three-dimensional field diagram illustrating the parameterization of isogradient contours on a three-dimensional isomagnitude surface.

In the RF transmission phase, a particular zone is excited by RF transmission at the appropriate central frequency with sufficient bandwidth to excite the entire zone. The thickness of the zone itself is chosen to ensure that this bandwidth requirement is met. Consider an isomagnitude contour surface separating two zones, labeled by 400 in FIG. 3. While the field strength itself is constant everywhere on this surface, the gradient magnitude varies along the surface. On the isomagnitude surface, there are isogradient closed curves along each of which the gradient magnitude is constant. The shaded strip 401 in FIG. 3 is an example of such an isogradient closed curve. These isogradient curves on the surface can be parametrized by a parameter s. Such curves form a family within the region of imaging interest where the parameter s lies within a certain range. To every value of s within this range, there corresponds a known gradient magnitude f(s). The gradient direction on each such isogradient curve of course varies along the curve and is normal to the surface. Strips 401 and 402 in FIG. 3 illustrate two such isogradient curves or contours on the isomagnitude surface 400.

After the spins in a given zone are excited by RF application or transmission, they precess back into alignment with the local static magnetic field. The precession occurs throughout in the presence of the gradient associated with the static field. This intrinsic gradient associated with the static magnetic field can be used as an inherent or natural readout gradient. Without loss of generality, we shall consider the case where the isomagnitude surfaces are rotationally symmetric. The generalization to the asymmetric case is straightforward.

Figure 4:
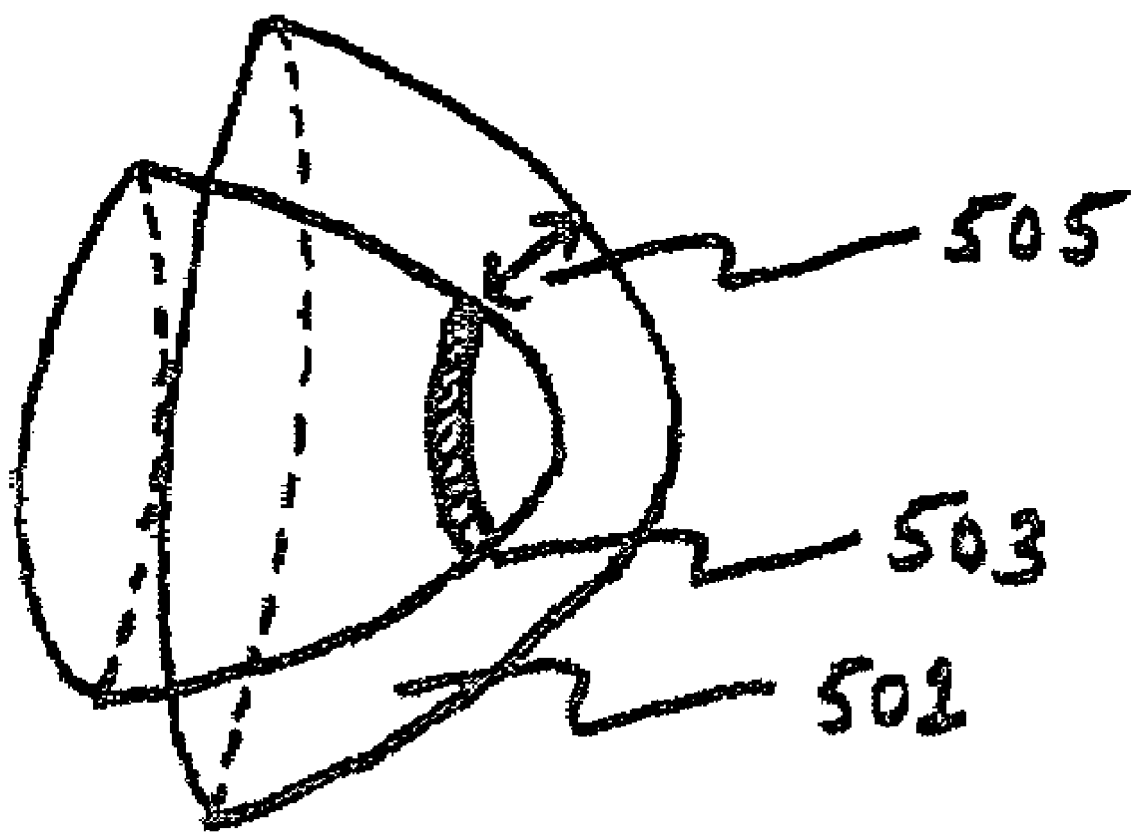
FIG. 4 is a three-dimensional field diagram illustrating the parameterization of isogradient contours on an isomagnitude surface, together with the zone thickness as determined by the intrinsic magnetic field gradient.

Since the gradient magnitude everywhere on an isogradient ring is the same, there is a single zone thickness value corresponding to a given isogradient parameter value s. An isogradient ring or strip 503 is illustrated in FIG. 4. For a given zone 501 indexed by i, let $R_i(s)$, indicated as 505 in FIG. 4, be the thickness of the zone at the corresponding parameter value s. Let $M_i(s)ds$ be the geometric area measure associated with the strip 503 shown in FIG. 4; this is the area of a strip such as that shown in FIG. 4 for strip width ds. Due to the assumed rotational symmetry, the local area measure on the strip is uniform. Let r be a distance parameter measured normal to the surface $S_i$ from the central surface, so that r varies from $-R_i(s)/2$ to $R_i(s)/2$ at parameter value s.

Let $\rho_i(s,r)$ be the total spin density in an annular strip at parameter value s at distance r measured from the central surface. This strip is shown as 603 in FIG. 5. Then after a suitable signal demodulation corresponding to removal of the central frequency of the zone, the total signal at time t (with time measured from the end of RF pulse transmission) due to the spins within the annular frustum shown as 601 in FIG. 5 can be written as $$dS_i = M_i(s)ds \int_{-R_i(s)/2}^{R_i(s)/2} dr \rho_i(s, r) e^{jk_s r} \quad (2)$$

where $k_s = kf(s) \equiv k_1 tf(s)$, where $k_1$ is a normalization constant. In equation (2) the integral is over the thickness of the zone at parameter value s.

Figure 5:
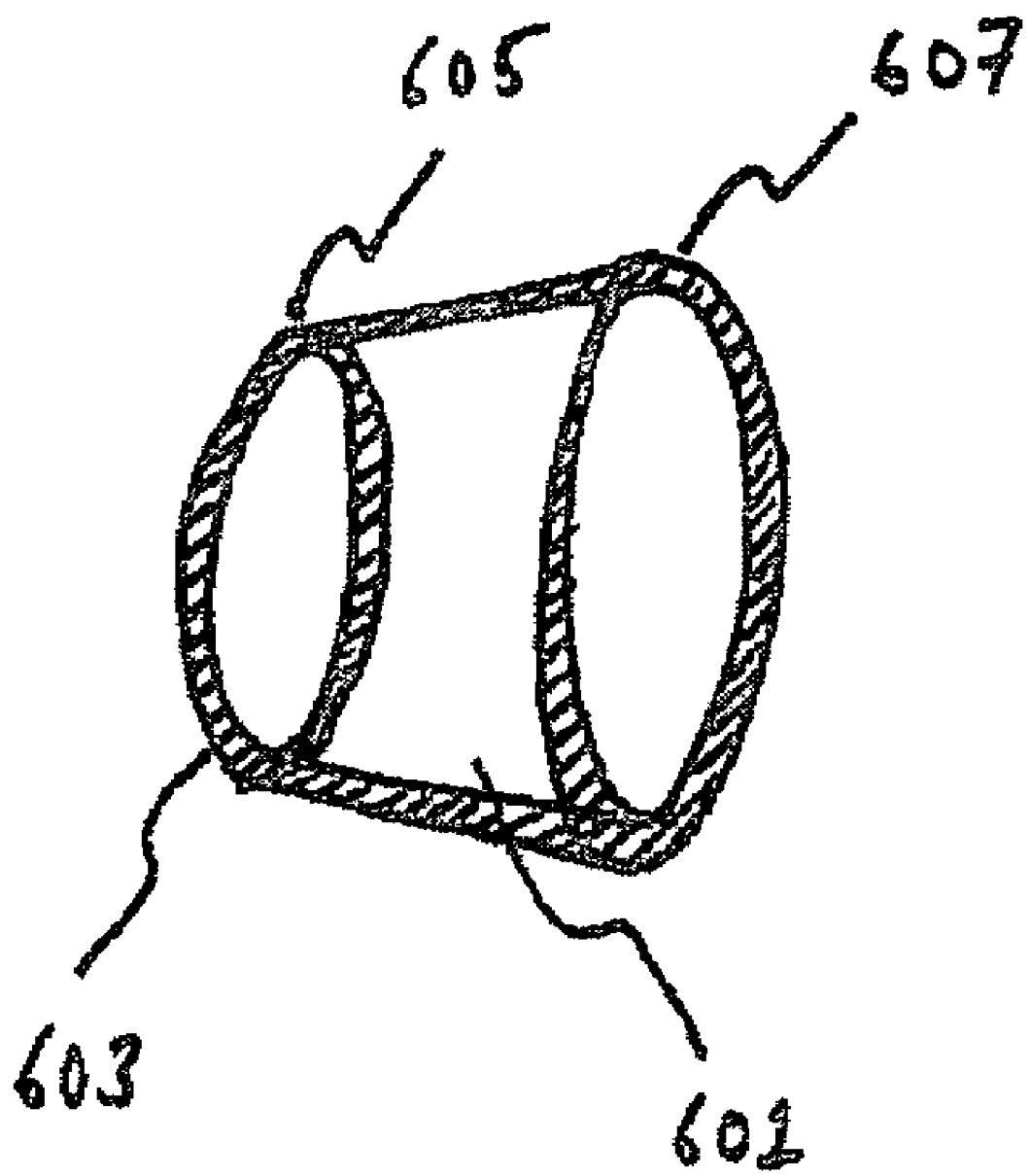
FIG. 5 is a three-dimensional field diagram depicting a portion of a spatial zone in the form of a "frustum shell" formed by two isogradient contour strips on adjacent isomagnitude surfaces.

The integration limits for the range of variation of the parameter r, $-R_i(s)/2$ and $R_i(s)/2$, are indicated by 605 and 607 in FIG. 5. The signal from the entire zone is then $$S_i^{tot}(k_s) = \int ds M_i(s) \int_{-R_i(s)/2}^{R_i(s)/2} dr \rho_i(s, r) e^{jk_s r} \quad (3)$$

A typical zone thickness (in the thinnest part of the zone) could be in the range 1-20 mm, although other values could be suitable depending on the static field spatial distribution pattern.

If only zone i is excited (with an RF pulse of frequency $\omega_i = \gamma B_i$, where $\gamma$ is the proton gyromagnetic ratio and $B_i$ is the central field strength in zone i), then equation (3) represents the subsequent entire resulting signal from the imaged sample. In a preferred embodiment, a typical value for the magnetic field strength $B_i$ could be in the range 0.02 Tesla to 0.2 Tesla, although other values could be suitable depending on the static field spatial distribution pattern specific to the magnets that are used in the system. Different magnet configurations and associated field distributions could be suitable in different imaging applications. Equation (3) can be inverted to obtain information about the spin density, as follows.

Define the quantity $$P(s', r') \equiv \int dk e^{-jkf(s')r'} \quad (4)$$

$$S_i^{tot}(k) = \int ds M_i(s) \int_{-R_i(s)/2}^{R_i(s)/2} dr \rho_i(s, r) \int dk e^{jk(rf(s)-r'f(s'))}$$

$$= \int ds M_i(s) \int_{-R_i(s)/2}^{R_i(s)/2} dr \rho_i(s, r) \delta[rf(s) - r'f(s')]$$

The integral over k is taken over the range $-\infty$ to $\infty$, or over 0 to $\infty$ if only real parts of the signal are used. Writing out the delta function in equation (4) above in the form of the identity $$\delta[rf(s) - r'f(s')] = \quad (5)$$

$$\delta(r - r')\delta(f(s) - f(s')) + \delta\left[f(s)\left(r - r'\frac{f(s')}{f(s)}\right)\right]$$

yields the result $$P(s', r') = \frac{M_i(s')\rho_i(s', r')}{|df(s')/ds'|} + \int ds \frac{M_i(s)}{|f(s)|} \rho_i\left(s, \frac{r'f(s')}{f(s)}\right) \quad (6)$$

Equation (6) is a Fredholm integral equation for the annular spin density $\rho_i(s,r)$. The left hand side is constructed, in practice in discretized form as a summation, from the signal $S_i^{tot}(k)$ at various k values, each corresponding to a particular value of time t (which defines a k value through the relation $k = k_1 t$). Since P(s',r') is therefore known, the equation can be inverted by discretization of the integral in the second term on the right into a sum, and solving the resulting system of linear equations for $\rho(s,r)$ at various values of s and r. For instance, an iterative method of solution that first obtains $\rho$ by neglecting the second term on the right and solving for $\rho$, followed by substitution of these values into the second term on the right, and subsequent iteration of the process of solving for ρ can be used effectively to find the total annular spin density ρ(s,r). This yields integrated 'rings' of spin densities for given values of s and r.

Identification of spin density at a given location on a given ring requires a phase encoding step with an applied external field gradient, in addition to the intrinsic field gradient that was used in the readout phase in the above example. This process is described below.

We suppose that the applied external field gradient is a single linear field gradient (corresponding to linearly varying external field within the region of interest) that is applied in a specific known direction for a time duration T (phase encoding step) everywhere in the region of interest. Without loss of generality, we assume that following excitation of the nuclear spins by RF transmission, a uniform field gradient $G_y$ is applied in the y-direction, corresponding to an applied magnetic field in the y-direction whose magnitude varies linearly in the y-direction with gradient $G_y$. The readout signal now depends on the time T used in the phase encoding step as well as on the magnitude of the applied gradient $G_y$. Let the readout signal from the zone indexed by i be written as $S_i(k,T,G_y)$.

Figure 6:
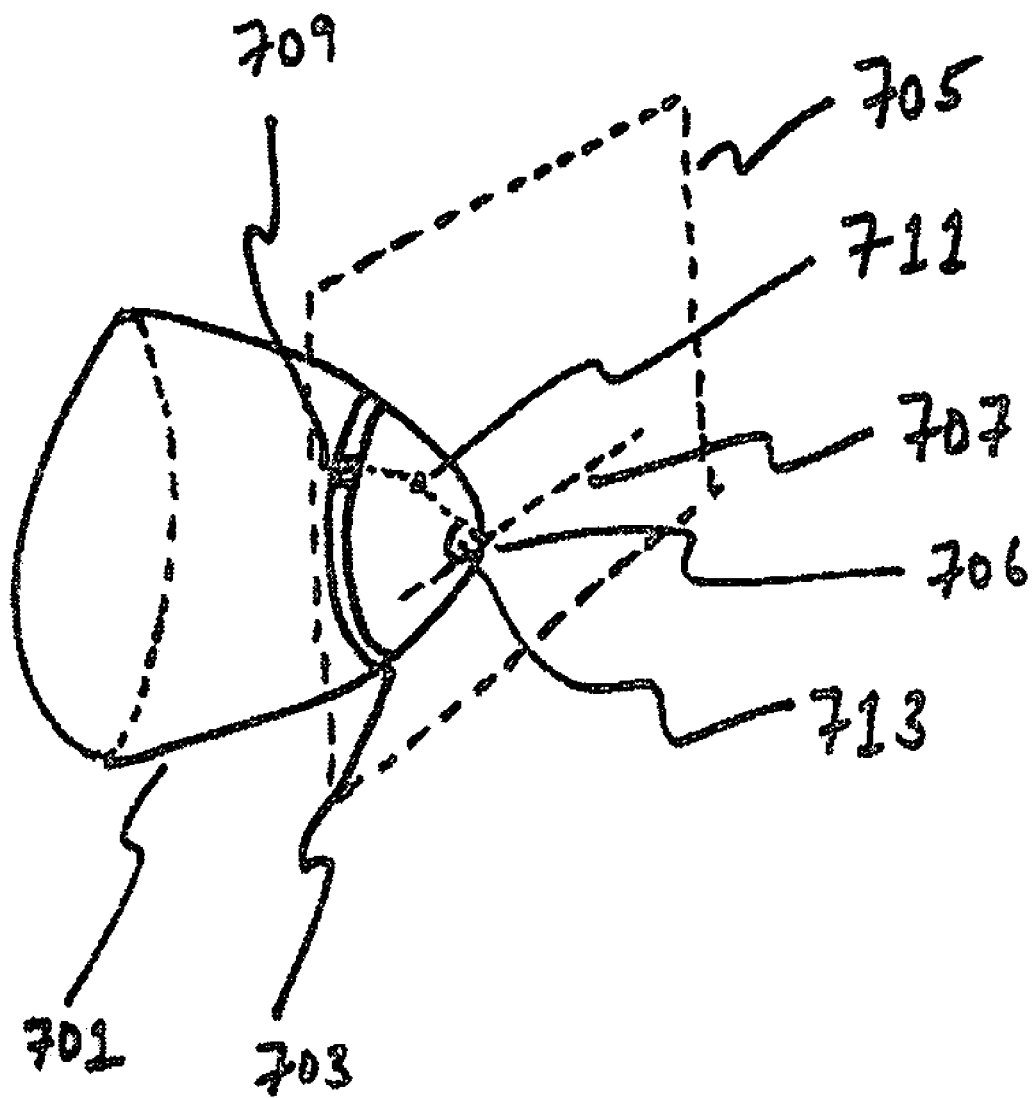
FIG. 6 is a three-dimensional field diagram illustrating the parameterization of a location on an isogradient contour by means of an angular variable.

Let θ parametrize different locations around the circumference of a given ring (for example, this could be an angular parameter ranging from 0 to 2θ). As an example of this parametrization, FIG. 6 illustrates an isomagnitude surface 701 with an isogradient strip parametrized by s shown as 703 in this figure. The imaginary plane 705 is tangential to the surface 703 at an extremal point 706 through which passes a line 713 parallel to one of the canonical coordinate directions. Given a location 709 on the isogradient strip 703, its circumferential location or parameter θ can be defined by the angle 713 subtended by its projection 711 on plane 705 with respect to line 707 passing through extremal point 706.

We now drop the assumption of rotational symmetry in the spatial field distribution pattern. In general, the local area measure $M_i(s,\theta)$ on a given contour/ring (for a given value of parameter s that characterizes a given isogradient contour/ring) also depends on θ. For example, this could be the case in the absence of any specific rotational symmetry in the spatial distribution of the static magnetic field. Spatial locations within the volume of interest can be parametrized by the three variables s, r, and θ. Here r parametrizes location within the "thickness" dimension of the zone and ranges in value from $-R_i(s)/2$ to $R_i(s)/2$, where $R_i(s)$ is the thickness of the zone at all locations on the isogradient ring parametrized by s. Let x(s,r,θ), y(s,r,θ), z(s,r,θ) be Cartesian spatial coordinates corresponding to a voxel in three dimensional space parametrized by s, r, and θ.

Figure 7:
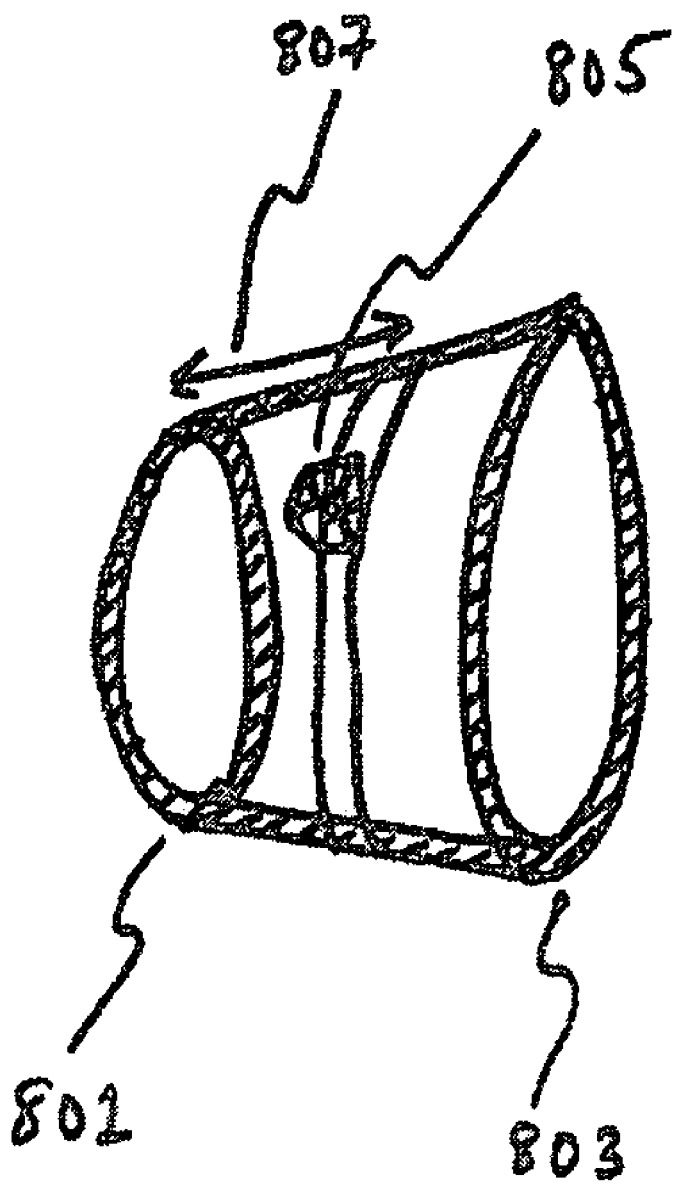
FIG. 7 is a three-dimensional field diagram showing the location and providing a visualization of a voxel defined on a "frustum shell" formed by two isogradient contour strips on adjacent isomagnitude surfaces according to the invention.

FIG. 7 depicts a "frustum" formed by an isogradient ring 801 on an isomagnitude surface (not shown) defining one boundary of a spatial zone as defined previously, connected to its counterpart isogradient ring 803 on the other boundary of the same zone. The voxel 805 in three dimensional space parametrized by s, r, and θ is shown in FIG. 7, where the parameter r is explicitly shown indicated as the distance 807 measured along the wall of the frustum 801.

As described earlier, by design the gradient of the static magnetic field within a given zone is known everywhere and is fixed in magnitude for a given isogradient ring labeled by its s value. Correspondingly, the gradient in a direction normal to the isomagnitude surfaces bounding the zone indexed by i is defined by the function $f(s)$ for every isogradient parameter value s. Let $x_0(s,\theta)$, $y_0(s,\theta)$, $z_0(s,\theta)$ be Cartesian spatial coordinates corresponding to a reference location on the ring parametrized by s with voxel parameters s, θ and $r=-R_i(s)/2$.

Let the spatial voxel spin density at a voxel (parametrized by s, r, and θ) within the zone be $\rho_i(s,r,\theta)$.

Define $F(s',r',T,G_y) \equiv \int dk e^{-jkr'f(s')} S_i(k,T,G_y)$ (7)

Proceeding analogously to the derivation of equation (6), one can obtain a relation involving the voxel spin densities of the form $$F(s', r', T, G_y) = \frac{1}{|df(s')/ds'|} \int d\theta K_{1,i}(s', r', T, G_y, \theta) \rho_i(s', r', \theta) + \int ds \int d\theta K_{2,i}(s, \theta) \rho_i\left(s, \frac{r'f(s')}{f(s)}, \theta\right)$$ (8)

Here $K_{1,i}$ and $K_{2,i}$ are appropriate convolution kernels. The kernel $K_{1,i}$ depends on the spatial distribution of the intrinsic gradient as well as on the applied external field gradient. Equation (8) is a Fredholm integral equation for the voxel spin density $\rho_i(s,r,\theta)$. The left hand side is known and is constructed, in practice in discretized form as a summation, from the signal $S_i^{tot}(k,T,G_y)$ at various k values, each corresponding to a particular value of time t (which defines a k value through the relation $k=k_1 t$), and at various values of the applied external gradient $G_y$. At least two values of phase encoding time T are needed to ensure that contributions from voxels with intrinsic gradient values symmetrical with respect to the y-axis are distinguished. Since $F(s',r',T,G_y)$ is therefore known for a variety of values of $G_y$ and T the equation can be inverted by discretization of the integral in the second term on the right into a sum, and solving the resulting system of linear equations for $\rho_i(s,r,\theta)$ at various values of s, r and θ. For instance, an iterative method of solution that first obtains $\rho_i$ by neglecting the second term on the right and solving a linear system (arising from the discretized sum over θ in the first term) for $\rho_i$, followed by substitution of these values into the second term on the right, and subsequent iteration of the process of solving for $\rho_i$ can be used effectively to find the voxel spin density $\rho_i(s,r,\theta)$. In practice, the discretization involved in the thickness dimension of a zone is much smaller than the number of elements along the circumference of a ring. Typical discretization values, for purposes of illustrative example only, could be 200×5×400 in the s, r and θ dimensions, respectively. The iterative solution technique described here yields a fast and efficient method of determining the voxel spin densities from equation (8).

The ability to image in three dimensions with a single applied external gradient field is one of the novel features of the method of the present invention. This helps to minimize the hardware associated with the construction of such an MR Imaging system, together with minimization of the associated equipment costs. While a generalization of the method of the invention is possible, it can be used to image with more than one applied external gradient field, and in fact such an implementation can be carried out by a person skilled in the art according to the teachings herein and remain true to the principles and scope of the present invention, the possibility of imaging with a single external gradient is nevertheless an attractive feature of the present invention.

Likewise, similar to the excitation of nuclear spins by means of applied RF pulse transmissions followed by phase encoding precession of the spins in the presence of an applied external magnetic field gradient, it is also possible in another embodiment to receive the RF signals emitted by the nuclear spins in the presence of an applied external magnetic field gradient in addition to the intrinsic magnetic field gradient of the static magnetic field produced by the system.

Since the signal acquisition and processing technique described herein explicitly accounts for (and indeed takes advantage of) static magnetic field inhomogeneities, together with appropriate voxel construction, it avoids to a large extent the dephasing problems that typically place strong restrictions on the extent of permissible static magnetic field inhomogeneities in standard MR Imaging technology. Further minimization of dephasing effects can be obtained by the use of tailored Radio Frequency pulse sequences, such as spin refocusing spin echo sequences familiar to persons skilled in the art. In one preferred embodiment, a tradeoff can be made in the selection of spatial zones between spatial zone width and the number of spin echoes acquired for signal averaging and enhancement.

It is worth noting that the resolution and voxel size and shape obtained upon imaging is generally dependent on the shape and separation of the isomagnitude surfaces. This is in turn determined by the spatial variation of the intrinsic magnetic field gradient. Thus, regions of high intrinsic magnetic field gradient, such as neighborhoods of extremal points on the isomagnitude surfaces, would have the highest associated spatial resolution. The intrinsic magnetic field gradient in the various zones clearly also determines the associated RF pulse bandwidths required for imaging.

The various zones in the static field distribution can be excited by separate RF pulses with different suitable center RF frequencies. It is also possible to transmit pulses encompassing or carrying RF excitation frequencies corresponding to more than one zone simultaneously. Thus, in one preferred embodiment, the zones of the static magnetic field are each excited by distinct and separate RF pulses. In one embodiment, transmission of an RF pulse corresponding to excitation of one zone could occur simultaneously with RF reception (at a different center RF frequency) of previously excited spins from a second zone. In another preferred embodiment, the RF excitation/transmission pulse could excite more than one zone simultaneously, and likewise the RF signals received could arise simultaneously from more than one previously excited zone. In still another preferred embodiment, RF excitation of a multiplicity of a first set of zones occurs simultaneously with reception of RF signals from a multiplicity of a second set of zones.

The range of static field strengths within the imaged volume of interest determines the range of RF frequencies involved. The electronic circuitry in the system responsible for controlling the RF excitation/transmission and reception can have different sub-systems optimized for operation of different RF frequency ranges with minimal power loss. In this manner, the entire range of RF frequencies needed to appropriately image the volume of interest can be covered. In a preferred embodiment, the RF electronics can be based on a digital electronics system with signal acquisition and/or processing parameters that can be programmable. In an alternate preferred embodiment, the electronics can be of analog design interfaced with a digital front end that can be used to programmably define a set or subset of signal acquisition and/or processing parameters.

The signal bandwidth needed to excite a particular zone can be calculated in the standard manner used in typical MR Imaging systems. Thus for instance, requiring a uniform excitation amplitude over the range of RF frequencies represented by a zone leads to a standard sinc function for the time dependence of a single RF pulse. The range of field strengths used to image the volume of interest can be anywhere within the approximate range 0.08 to 0.2 Tesla in one preferred embodiment. In another preferred embodiment it can be between 0.06 Tesla and 0.15 Tesla. In a third preferred embodiment it can be between 0.02 Tesla and 0.12 Tesla, while in a fourth preferred embodiment it can be between 0.1 Tesla and 0.4 Tesla. In a fifth preferred embodiment the upper end of the static field strength range can be as large as 3 Tesla. These ranges are provided as examples only, and other ranges of field strengths can be used according to the teachings of the present invention, depending on convenience and imaging requirements, without departing from its spirit and scope.

For purposes of non-limiting example, within the (imaging) volume of interest, the variation (between minimum and maximum values, measured with respect to the maximum value) in the static field strength magnitude can be anywhere from 0.01% to 90%. Again as a non-limiting typical example, the number of zones used by the imaging process can be anywhere from 1 to 60, while the minimum thickness of an individual zone can be preferably in the range 1 mm to 30 cm, and more preferably in the range 1 mm to 30 mm.

In one preferred embodiment, the static magnetic field is generated by a single magnet, which can be a permanent magnet or a coil-based magnet. In an alternate preferred embodiment, the static magnetic field is generated by more than one magnet, each of which can be either a permanent magnet or a coil-based magnet. In any case, the spatial distribution of the net static magnet field within the imaging volume is considered known, as described earlier.

Figure 8:
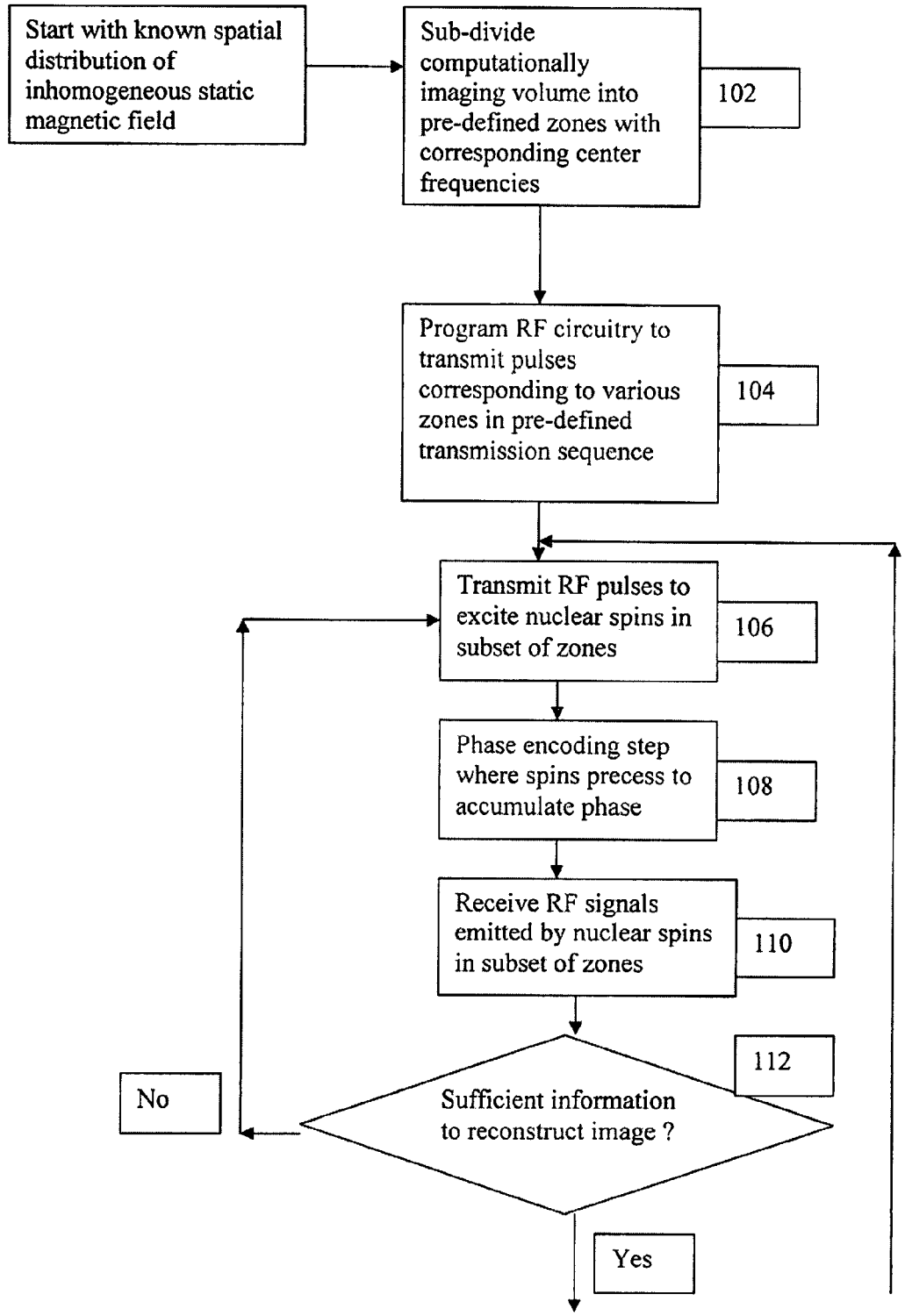
FIG. 8 is a flow chart of a method for signal generation, signal acquisition, and image reconstruction according to the invention.
Figure 8:
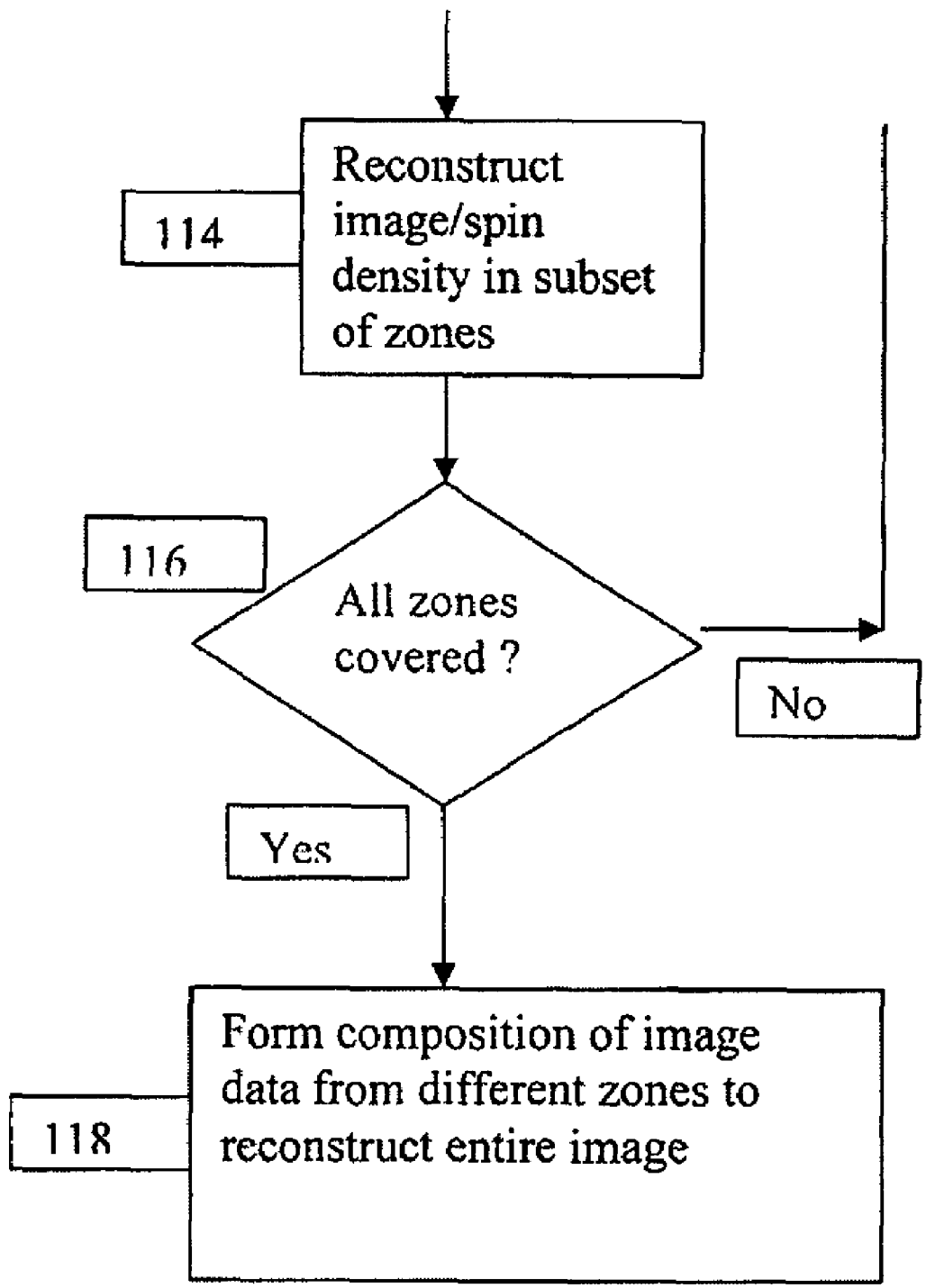

FIG. 8 is a flowchart illustrating the method of signal acquisition and signal processing according to the present invention. Starting from a known spatial distribution of the inhomogeneous static magnetic field 100, in step 102 the imaging volume is computationally divided into spatial zones within which the magnetic field strength variation is approximately linear by means of isomagnitude surfaces, as described earlier. Each such spatial zone has a corresponding center frequency associated with it, based approximately on the mean field strength within the zone. In step 104 the RF electronics is programmed to transmit RF pulses corresponding to various spatial zones in any one of a set of pre-defined transmission sequences. The RF pulses are transmitted in step 106 to excite the nuclear spins in a subset of the spatial zones. The excited nuclear spins continue to precess during a phase encoding time period in step 108 where the precession occurs in the presence of an externally applied magnetic field gradient (in addition to the intrinsic static magnetic field gradient associated with the inhomogeneous static magnetic field). In step 110, Radio Frequency signals from the precessing nuclear spins within a subset of the spatial zones are received by an imaging or receive coil. In step 112, if the signal information received thus far is not sufficient to reconstruct the nuclear spin density distribution or image within a subset of the spatial zones, the process starting from step 106 is repeated with a different phase encoding time and/or a different applied external field gradient in order to accumulate further data. If sufficient signal data has been collected as determined in step 112, the three dimensional spin density distribution or image is computationally reconstructed in step 114 in a subset of the spatial zones by solving a suitable set of equations for the spin density distribution. In step 116, it is determined whether all the spatial zones have been covered in the reconstruction. If not, the process repeats starting from step 106. If all the zonal image data has been reconstructed, the entire image within the imaging volume is reconstructed in step 118 by composition or a process of piecing together of reconstructed image data from all the different relevant spatial zones. The composition process may include, without limitation, image processing techniques such as averaging, interpolation, thresholding and the like, as would be familiar to persons skilled in the art.

The image reconstruction quality and resolution depends significantly on the Signal to Noise Ratio (SNR) of the received RF signal. The SNR in turn depends significantly on the type of conductor used in the imaging/receiving coil and its electrical properties. In particular, the SNR associated with a Magnetic Resonance imaging system is inversely proportional to the square root of the total signal reception resistance at the frequencies of relevance. At the frequencies corresponding to static field strengths up to about 0.2 Tesla (frequencies of up to 8.7 MHz), the signal reception resistance is typically dominated by the receiver coil resistance. Reductions in the latter quantity can lead to significant gains in SNR.

In this context, we note that Carbon nanotubes have been shown to possess the property of ballistic charge conductance. When fabricated into macroscopic structures, such as for example a conducting Carbon nanotube sheet (as described in M. Zhang et al, *Science*, Aug. 19, 2005, p. 1215), the property of ballistic conductance may not be present at macroscopic length scales. However, the presence of ballistic conductance solely at microscopic length scales can still lead to highly efficient charge transport with minimal scattering that occurs mainly at contacts between distinct nanotubes. The number of such contacts can be minimized if the carbon nanotubes used in the fabrication of the conducting sheet are as long in length as is practical; an average length of 200 microns or longer is desirable. The electrical transport resistance associated with such a conductor can be further reduced by forming a composite conductor, for example consisting of layered sheets connected electrically in parallel. Thus, one method of maximizing SNR consists of constructing RF imaging or receiver coils made of Carbon nanotube conductor constructed as a layered composite of nanotube sheets. As a non-limiting illustrative example, a typical such layered structure can be made of anywhere between 5 and 500 layers or distinct nanotube sheets that are electrically in parallel with each other. In one preferred embodiment, a nested, layered construction of sheets is used in the receiver coil(s), each layer itself consisting of further layers of sheets. In a preferred embodiment of the present invention, at least one type of high SNR conductor, such as Carbon nanotube-based conductors, or other forms of high SNR conductors such as cooled low-resistance metals, or high temperature superconductors is present in at least one receiver coil used to pick up Radio Frequency signals emitted by the nuclear spins.

The RF circuitry that the receiving coil is connected to is designed to minimize signal power loss. Thus for instance, impedance matching techniques are designed into the circuitry for optimal signal power during reception (and also transmission in an embodiment where the receiving coil is also used as a RF transmission coil). Likewise, the RF circuitry is designed to also maximize the quality factor Q associated with the signal reception circuitry to allow for maximal sensitivity and specificity in the signal from each zone. Depending on whether good metallic conductors such as Copper or Silver or low-resistance Carbon nanotube conductors are used in the imaging/receiving coil(s), the specific parameters of the RF receiving circuitry can be different and appropriately designed for optimal reception with the particular type of conductor used in the imaging coils.

A multiplicity of receiver coils can be used in one preferred embodiment in order to further enhance the SNR. Thus for instance, two or more receiver coils can be used in phased-array form such that the net noise from the receiver coils is on average smaller than the noise in either. In one preferred embodiment, each of the receiver coils is positioned so as to cover or be spatially close to different regions of patient anatomy, so that the overall image reconstruction is of approximately uniformly good quality everywhere.

Spin echo or Gradient echo Radio Frequency pulse sequences, and other such pulse sequences similar to those used in standard MR Imaging, could also be used according to the present invention, for example in order to effect repeated rephrasing or refocusing of the spins in order to maximize the received Radio Frequency signal. In such a case, signal averaging over repeated refocusing pulses can further enhance the SNR.

The size and range of magnetic field strengths of the Magnetic Resonance Imaging system constructed and built to function according to the description and teaching of the present invention can be tailored to suit customized imaging applications, or it can be designed as a general purpose system. In the case of a general purpose system, the set of magnets or magnet that generate(s) the static magnetic field is designed to accommodate a major portion of the anatomy of a typical sized patient. In other embodiments, the magnet(s) generating the static magnetic field can be constructed in customized fashion to conveniently accommodate, for example, neuroanatomy, peripheral anatomy, cardiology, liver imaging applications, or other medical applications for optimal image generation purposes.

Furthermore, the teachings of the present invention can be used to make MR Imaging systems that permit greater or more open access to the patient, a feature important for interventional medical applications performed together with Magnetic Resonance Imaging ("Interventional MR"). In such applications, it is useful to optimize the shape and size of the magnet(s) used to generate the static magnetic field to accommodate both the patient and the physician in the vicinity of the patient.

Other medical applications of the imaging method and apparatus of the present invention include functional MR imaging, which is used to study and monitor the blood flow corresponding to brain activity associated with various types of cognitive tasks, as well as MR spectroscopic or chemical shift imaging where the presence or concentrations of some types of biologically relevant molecules is measured.

All the medical applications discussed herein, and developed according to the invention, are further enhanced by the use of low resistance conductors in the imaging coils, an example of such being conductors made from Carbon nanotubes. In some embodiments, the conductors including Carbon nanotubes exhibit ballistic charge transport at microscopic or macroscopic lengths.

It is important to note that the descriptions and specific examples and embodiments given herein are discussed so as to provide one skilled in the art a teaching sufficient to construct an efficient Magnetic Resonance Imaging system. Other embodiments can differ, for purposes of non-limiting example, in various details, such as RF pulse transmission sequences, applied magnetic field gradients, signal processing details, specifics of Radio Frequency circuitry, receiver coil design and materials and the like, depending on the convenience for the system implementation, or for the particular application at hand without departing from the spirit and scope of the present invention.

Other modifications and implementations will occur to those skilled in the art without departing from the spirit and the scope of the invention as claimed. Accordingly, the above description is not intended to limit the invention except as indicated in the following claims.

The invention claimed is:

1. An apparatus for magnetic resonance imaging, the apparatus comprising:
   at least one magnet generating an externally applied static magnetic field within an imaging volume;
   a spatially inhomogeneous distribution of the static magnetic field with non-planar contours of uniform magnitude within the imaging volume;
   at least one gradient field producing coil capable of producing a magnetic field gradient in a known spatial direction within the imaging volume;
   Radio Frequency electronic circuitry for generating and transmitting Radio Frequency pulses with specified pulse parameters into the imaging volume;
   at least one receiving coil capable of receiving Radio Frequency signals emitted by nuclear spins in the imaging volume; and
   means to computationally process received Radio Frequency signals to reconstruct an image representing the distribution of nuclear spin density within at least a portion of the imaging volume.

2. The apparatus of claim 1, wherein the at least one gradient field-producing coil is part of a set of coils.

3. The apparatus of claim 1, wherein the Radio Frequency electronic circuitry is capable of generating a range of Radio Frequency pulses, each pulse being centered around one of a plurality of frequencies within a range of frequencies from a minimum frequency to a maximum frequency.

4. The apparatus of claim 3, wherein the difference between the maximum frequency and minimum frequency is between about 0.01% and 10% of the maximum frequency.

5. The apparatus of claim 3, wherein the difference between the maximum frequency and minimum frequency is between about 10% and 90% of the maximum frequency.

6. The apparatus of claim 3, wherein each of the Radio Frequency pulses centered around one of the plurality of frequencies excites nuclear spins within one spatial zone among a plurality of spatial zones covering the entire imaging volume.

7. The apparatus of claim 1, wherein the static magnetic field within the imaging volume is an externally applied static magnetic field.

8. The apparatus of claim 1, wherein the Radio Frequency electronic circuitry and transmission means is programmable.

9. The apparatus of claim 1, wherein the Radio Frequency electronics receives Radio Frequency signals from a first spatial zone within the imaging volume while simultaneously transmitting at least one Radio Frequency pulse that excites nuclear spins in a second spatial zone distinct from the first spatial zone.

10. The apparatus of claim 1, wherein the Radio Frequency electronics sequentially generate Radio Frequency pulse transmissions that cause excitation of nuclear spins in a first spatial zone prior to excitation of nuclear spins in a second spatial zone.

11. The apparatus of claim 1, wherein the at least one receiving coil capable of receiving Radio Frequency signals emitted by nuclear spins in the imaging volume includes a plurality of receiving coils arranged as a phased array of receiving coils.

12. The apparatus of claim 1, wherein the Radio Frequency electronic circuitry is capable of generating a range of Radio Frequency pulses, wherein each Radio Frequency pulse is a superposition in the frequency domain of distinct segments, each segment being centered around one of a plurality of frequencies within a range of frequencies from a minimum frequency to a maximum frequency.

13. The apparatus of claim 12, wherein each Radio Frequency pulse excites nuclear spins simultaneously within more than one spatial zone among a plurality of spatial zones spanning the entire imaging volume.

14. The apparatus of claim 12, wherein the Radio Frequency electronics are able to receive Radio Frequency signals from at least one spatial zone in a first set of spatial zones, while simultaneously transmitting at least one Radio Frequency pulse that excites nuclear spins in at least one spatial zone in a second set of spatial zones distinct from the first set of spatial zones.

15. The apparatus of claim 12, wherein the difference between the maximum frequency and minimum frequency is between about 10% and 90% of the maximum frequency.

16. The apparatus of claim 12, wherein the difference between the maximum frequency and minimum frequency is between about 0.01% and 10% of the maximum frequency.

17. The apparatus of claim 12, wherein each segment centered around one of a plurality of frequencies excites nuclear spins within one spatial zone among a plurality of zones spanning the entire imaging volume.

18. The apparatus of claim 12, wherein the Radio Frequency electronic circuitry sequentially generates Radio Frequency pulse transmissions that cause excitation of nuclear spins in a first set of spatial zones prior to excitation of nuclear spins in a second set of spatial zones.

19. The apparatus of claim 12, wherein at least one receiving coil includes a conductor made from Carbon nanotube material.

20. The apparatus of claim 19 wherein the magnetic field gradient is produced substantially only in a single known spatial direction within the imaging volume.

21. The apparatus of claim 12, wherein at least one receiving coil is made from a layered structure of Carbon nanotube sheets electrically connected in parallel.

22. The apparatus of claim 1, wherein the Radio Frequency electronic circuitry is capable of generating compound Radio Frequency pulses, each compound Radio Frequency pulse being a superposition in the frequency domain of distinct pieces, each piece being centered around one of a plurality of frequencies within a range of frequencies from a minimum frequency to a maximum frequency.

23. The apparatus of claim 22, wherein the difference between the maximum frequency and minimum frequency is between about 0.01% and 10% of the maximum frequency.

24. The apparatus of claim 22, wherein the difference between the maximum frequency and minimum frequency is between about 10% and 90% of the maximum frequency.

25. The apparatus of claim 22, wherein each of the compound Radio Frequency pulses excites nuclear spins within one spatial zone among a plurality of zones covering the entire imaging volume.

26. The apparatus of claim 22, wherein the Radio Frequency electronic circuitry receives Radio Frequency signals from a first spatial zone within the imaging volume, while simultaneously transmitting at least one Radio Frequency pulse that excites nuclear spins in a second spatial zone distinct from the first spatial zone.

27. The apparatus of claim 22, wherein the Radio Frequency electronic circuitry generates Radio Frequency pulse transmissions that cause excitation of nuclear spins in a first spatial zone, prior to excitation of nuclear spins in a second spatial zone.

28. The apparatus of claim 1, wherein the at least one receiving coil includes a conductor made from Carbon nanotube material.

29. The apparatus of claim 28, wherein the magnetic field gradient is produced substantially only in a single known spatial direction within the imaging volume.

30. The apparatus of claim 1, wherein the at least one receiving coil is made from a layered structure of Carbon nanotube sheets electrically connected in parallel.

* * * * *